US008170169B2

(12) United States Patent
Martin et al.

(10) Patent No.: US 8,170,169 B2
(45) Date of Patent: May 1, 2012

(54) SERIALIZER DESERIALIZER CIRCUITS

(75) Inventors: Kenneth W. Martin, Toronto (CA);
Jonathan E. Rogers, Toronto (CA);
Tony Pialis, Toronto (CA); Mehrdad Ramezani, Toronto (CA)

(73) Assignee: Snowbush Inc. (CA)

( * ) Notice: Subject to any disclaimer, the term of this patent is extended or adjusted under 35 U.S.C. 154(b) by 943 days.

(21) Appl. No.: 11/998,695

(22) Filed: Nov. 30, 2007

(65) Prior Publication Data
US 2008/0130816 A1    Jun. 5, 2008

Related U.S. Application Data

(60) Provisional application No. 60/868,137, filed on Dec. 1, 2006.

(51) Int. Cl.
*H03D 3/24* (2006.01)
(52) U.S. Cl. ............................ 375/373; 375/371
(58) Field of Classification Search .............. 375/373; 331/57
See application file for complete search history.

(56) References Cited

U.S. PATENT DOCUMENTS

| | | | | |
|---|---|---|---|---|
| 3,997,848 A * | 12/1976 | Rippy | | 329/346 |
| 5,727,038 A * | 3/1998 | May et al. | | 375/376 |
| 7,102,449 B1 * | 9/2006 | Mohan | | 331/57 |
| 7,463,873 B2 * | 12/2008 | Staszewski et al. | | 455/260 |
| 7,557,623 B2 * | 7/2009 | Moehlmann et al. | | 327/156 |
| 7,777,577 B2 * | 8/2010 | Jennings et al. | | 331/17 |
| 2001/0000456 A1 * | 4/2001 | McGowan | | 370/342 |
| 2006/0009184 A1 * | 1/2006 | Goldman | | 455/260 |
| 2006/0056563 A1 * | 3/2006 | Aweya et al. | | 375/376 |
| 2006/0139105 A1 * | 6/2006 | Maxim et al. | | 331/16 |
| 2006/0290435 A1 * | 12/2006 | Staszewski et al. | | 331/16 |
| 2008/0116982 A1 * | 5/2008 | van der Valk et al. | | 331/18 |
| 2009/0085679 A1 * | 4/2009 | Jennings et al. | | 331/1 A |
| 2009/0140773 A1 * | 6/2009 | Cheung | | 327/3 |

OTHER PUBLICATIONS

Afshin Rezayee, High-Speed Clock and Data Recovery Circuits in CMOS Technology, 2003.
DaDalt *A Design-Oriented Study of the Nonlinear Dynamics of Digital Bang-Bang PLLs,*, IEEE Transacitons on Circuits and Systems-I: Regular Papers, vol. 52, No. 1, Jan. 2005.
Perrott, *A 2.5Gh/s Multi-Rate 0.25 m CMOS CDR Utiliaing a Hybrid Analog/Digital Loop Filter,* 2006 IEEE International Solid-State Circuits Conference.

* cited by examiner

*Primary Examiner* — Chieh M Fan
*Assistant Examiner* — Santiago Garcia
(74) *Attorney, Agent, or Firm* — Arthur M. Reginelli

(57) ABSTRACT

A phase lockedcircuit comprising a phase detector for comparing an incoming serial data signal with a feedback clock signal and generating a digital phase detector output signal representing a phase difference between the incoming data signal and the feedback clock signal; a dual path filter for receiving the phase detector output signal, the dual path filter including a first path for generating a digital proportional output signal that is proportional to the phase detector output signal and a second path having an integral digital filter for generating a digital integral output signal that is proportional to an integral of the phase detector output signal; and a digitally controlled oscillator for receiving the proportional output signal and the integral output signal as tuning inputs and generating in dependence thereon an output clock signal from which the feedback clock signal is obtained. The circuit can be implemented in a receive path of a serializer/deserializer.

26 Claims, 8 Drawing Sheets

SERIALIZER DESERIALIZER CIRCUITS

RELATED APPLICATIONS

This application claims the benefit of and priority to U.S. Provisional Patent Application Ser. No. 60/868,137, files Dec. 1, 2006, which is incorporated herein by reference.

BACKGROUND

This application relates to circuits such as clock and data recovery circuits, clock multiplier circuits and oscillator circuits that can be used in serializer/deserializer circuits.

A serializer/deserializer (SERDES) is an integrated circuit (IC) transceiver that converts parallel data to serial data and vice-versa. A SERDES includes a transmitter section having a parallel-to-serial converter, and a receiver section having a serial-to-parallel converter. SERDES circuits facilitate the transmission of parallel data between two points over serial streams, reducing the number of data paths and thus the number of connecting PINs or wires required for each IC.

SERDES circuits can include phase locking circuits that contain oscillators and that are used for implementing clock multiplier units and clock and data recovery units among other things.

SUMMARY

Phase locking circuits and oscillators that can be used in SERDES and other circuits are disclosed herein.

According to one example embodiment is a clock and data recovery circuit that includes a phase detector, a dual path filter and a digitally controlled oscillator. The phase detector compares an incoming serial data signal with a feedback clock signal and generates a digital phase detector output signal representing a phase difference between the incoming data signal and the feedback clock signal. The dual path filter receives the phase detector output signal, and includes a first path for generating a digital proportional output signal that is proportional to the phase detector output signal and a second path having an integral digital filter for generating a digital integral output signal that is proportional to an integral of the phase detector output signal. The digitally controlled oscillator receives the proportional output signal and the integral output signal as tuning inputs and generates in dependence thereon an output clock signal from which the feedback clock signal is obtained.

According to another example embodiment is a is a clock and data recovery method that includes: comparing, at a phase detector, an incoming serial data signal with a feedback clock signal and generates a digital phase detector output signal representing a phase difference between the incoming data signal and the feedback clock signal; receiving, at a dual path filter, the phase detector output signal, and generating a digital proportional output signal that is proportional to the phase detector output signal and a digital integral output signal that is proportional to an integral of the phase detector output signal; and receiving, at a digitally controlled oscillator, the proportional output signal and the integral output signal as tuning inputs and generating in dependence thereon an output clock signal from which the feedback clock signal is obtained.

According to another example embodiment is a clock multiplier phase locking circuit for producing an output signal that is a multiple of a reference clock signal, the clock multiplier phase locking circuit including a phase frequency detector, a loop filter, an oscillator and a feedback block. The phase frequency detector compares a reference clock signal with a feedback clock signal and generates an error signal representing a phase difference and a frequency difference between the reference clock signal and the feedback clock signal. The loop filter receives the error signal, the loop filter comprising a proportional path and an integral path, the proportional path including a proportional chargepump and a first passive filter for producing a proportional tuning voltage signal that is proportional to the error signal, the integral path including an integral chargepump and a second passive filter for producing an integral tuning voltage signal that is proportional to an integral of the error signal. The oscillator receives the proportional tuning signal and the integral tuning signal as tuning inputs and generates in dependence thereon an output clock signal from which the feedback clock signal is obtained. The feedback block has a divider for dividing the output clock signal from the oscillator to provide the feedback clock signal for the phase frequency detector.

According to another example embodiment is a clock multiplier method for producing an output signal that is a multiple of a reference clock signal, the method including: comparing, at a phase frequency detector, a reference clock signal with a feedback clock signal and generating an error signal representing a phase difference and a frequency difference between the reference clock signal and the feedback clock signal; receiving the error signal at a loop filter that includes a proportional path and an integral path, the proportional path including a proportional chargepump and a first passive filter producing a proportional tuning voltage signal that is proportional to the error signal, the integral path including an integral chargepump and a second passive filter producing an integral tuning voltage signal that is proportional to an integral of the error signal; receiving at an oscillator the proportional tuning signal and the integral tuning signal as tuning inputs and generating in dependence thereon an output clock signal from which the feedback clock signal is obtained; and dividing the output clock signal from the oscillator to provide the feedback clock signal for the phase frequency detector.

According to another example embodiment is a multi-stage ring oscillator circuit. The ring oscillator circuit includes a ring of at least four identical differential delay stages, wherein each delay stage has three pairs of differential inputs and one pair of differential outputs, and each delay stage receives as differential inputs the differential outputs of three preceding delay stages.

BRIEF DESCRIPTION OF FIGURES

Embodiments of the invention will now be described by way of example only, and with reference to the accompanying drawings, in which.

DESCRIPTION

Figure 1:
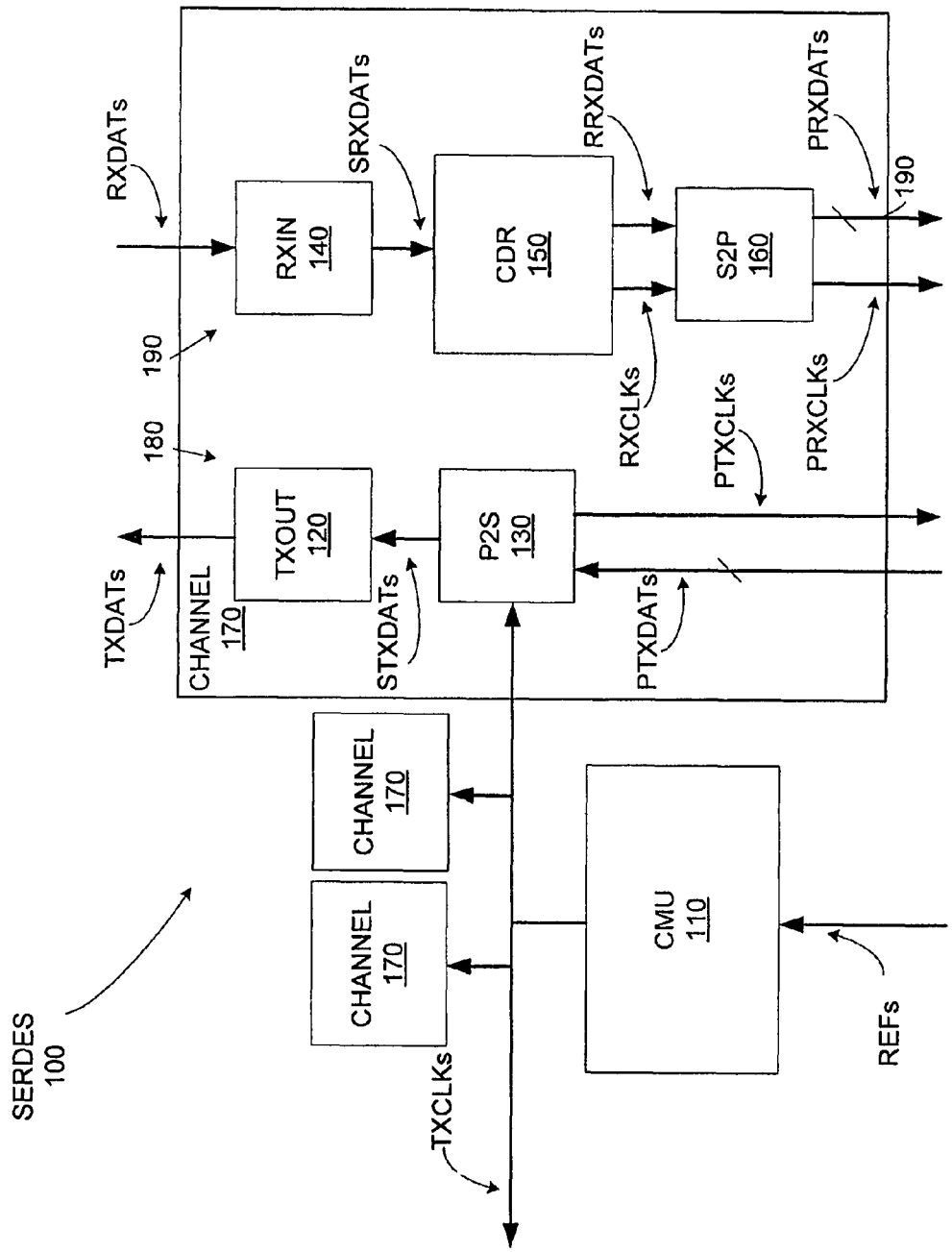
FIG. 1 is a block diagram of a SERDES (serializer, deserializer) in accordance with an embodiment of the invention.

Referring to FIG. 1 a block diagram of a SERDES (serializer deserializer) for an integrated circuit consistent with example embodiments of the invention is indicated generally at 100. SERDES 100 is comprised of two main sub-blocks, a clock multiplier unit phase lock loop (CMU 110) and a data channel (Channel 170). As indicated in FIG. 1, a single clock multiplier unit CMU 110 can support multiple channels 170. The clock multiplier unit CMU 110 takes a reference clock REFs and multiplies its frequency in order to generate transmit clock signals TXCLKs. Transmit clock signals TXCLKs are then distributed to the channels 170.

Although a number of channels 170 are represented in FIG. 1, only one channel 170 is shown in detail. Each Channel 170 is comprised of a data transmit path 180 and a data receive path 190. The transmit path 180 includes a parallel to serial (P2S) converter 130 and a transmit driver 120. The flow of the data through the transmit path 180 is as follows: A parallel data bus which receives parallel data PTXDATs is clocked at a relatively low rate by a parallel transmit clock signal PTXCLKs. Parallel data PTXDATs enters the SERDES 100 at a parallel interface of the P2S converter 130. In P2S converter 130 the parallel data PTXDATs is time division multiplexed into a serial data stream STXDATs clocked by the high speed transmit clock signal TXCLKs. The serial output of P2S converter 130, STXDATs, is then buffered for transmission out of SERDES 100 by the transmit driver TXOUT 120. The output of the transmit driver 120 is transmitted data TXDATs, which exits the SERDES 100 as serial data.

The data receive path 190 includes a receive amplifier RXIN 140, a clock and data recovery unit CDR 150, and a serial to parallel converter 160. The data flow through the receive path 190 of the Channel 170 is as follows: Serial received data RXDATs enters SERDES 100 at the input of the receive amplifier RXIN 140, which buffers the serial received data. The clock and data recovery CDR 150 receives the buffered serial receive data SRXDATs from the receive amplifier RXIN 140. Clock and data recovery CDR 150 recovers from timing information present in the bit transitions of buffered serial receive data SRXDATs a clock signal (RXCLKs) synchronous with the incoming SRXDATs data. The recovered clock signal RXCLKs is used by the Clock and data recovery CDR 150 to sample and recover the incoming SRXDATs data stream. The recovered data RRXDATs and clock signal RXCLKs are then sent to the serial to parallel converter S2P 160. S2P converter 160 performs time division de-multiplexing on the serial bit stream RRXDATs to produce the parallel data stream PRXDATs on a parallel bus 195 and divides down the recovered clock signal RXCLKs to provide clock signal PRXCLKs which is synchronous to the parallel data stream on bus 195. The remainder of this description focuses on the key CMU and CDR blocks.

Figure 2:
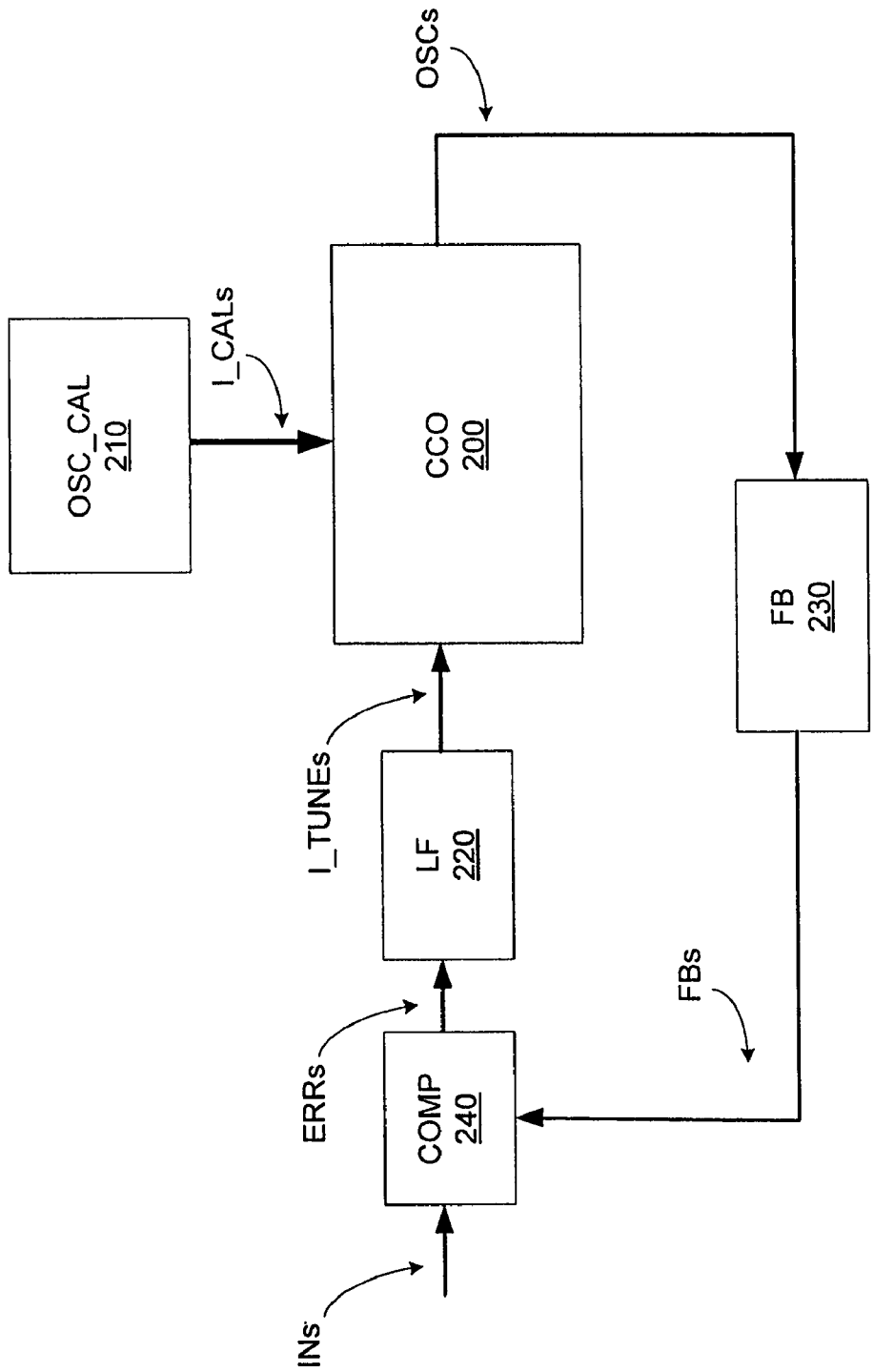
FIG. 2 is a block diagram of an oscillator control system including calibration in accordance with an embodiment of the invention.

For the purpose of facilitating an understanding of the circuits shown in the remaining Figures, FIG. 2 is a block diagram that illustrates a concept common to both the clock multiplier unit CMU 110 and the clock data recovery unit CDR 150 of each channel 170 in accordance with an example embodiment of the invention. Each of the clock multiplier unit CMU 110 and clock data recovery unit CDR 150 contain a current controlled oscillator CCO 200. CCO 200's controlling currents can be divided into two categories: (i) Calibrated control current I_CALs, which is a control current that is calibrated by calibration block OSC_CAL 210 (either at startup or periodically) and then in at least some example embodiments filtered to minimize noise during normal operation. The calibration process forces the center frequency of CCO 200 to be very close to the desired frequency of operation; and (ii) Tuning current I_TUNEs. This current is applied to CCO 200 via a feedback loop. The signal flow through the feedback loop is as follows. The CCO 200 output signal OSCs goes to a feedback block FB 230. Feedback block FB 230 outputs a signal FBs which is then compared to an input signal INs by a phase comparison block COMP 240. Phase comparison block COMP 240 outputs an error signal ERRs which is further processed by a loop filter block LF 220, which outputs the tuning current I_TUNEs. The feedback loop phase locks the input signal INs and the feedback signal FBs insuring that the phase and frequency of the signal OSCs output by oscillator 200 will also have a predictable relationship to the phase and frequency of the input signal INs. By calibrating oscillator CCO 200 to have a frequency very close to the desired frequency of operation, the amount of tuning required from the tuning current I_TUNEs is reduced. The reduced tuning current I_TUNEs tuning requirements allow a higher proportion of the total oscillator CO 200 control current to be calibrated control current I_CALs. Since the tuning current I_TUNEs currents are generally much noisier than the calibrated control current I_CALs this approach can produce improved jitter performance in the oscillator output signal OSCs. Jitter is a major factor limiting the overall performance of previous SERDES systems.

Some possible variations on the concepts illustrated in FIG. 2 are discussed below.

It is possible to sum the two control currents (I_CALs and I_TUNEs) before they are input to the oscillator CCO 200. Examples of possible summation processes include a simple sum, a weighted sum and a weighted sum with the addition of an offset. An embodiment which sums the control currents prior to the oscillator CCO 200 input may retain at least some of the advantages outlined above.

It is possible to calibrate the tuning current I_TUNEs prior to it entering the oscillator CCO 200 or being summed with I_CALs. Possible embodiments of this include multiplying the raw tuning current by a factor which is proportional to the result of the calibration process. This may have the advantage of reducing the variation of the ratio of I_CALs to I_TUNEs with respect to the result of the calibration process.

Figure 3:
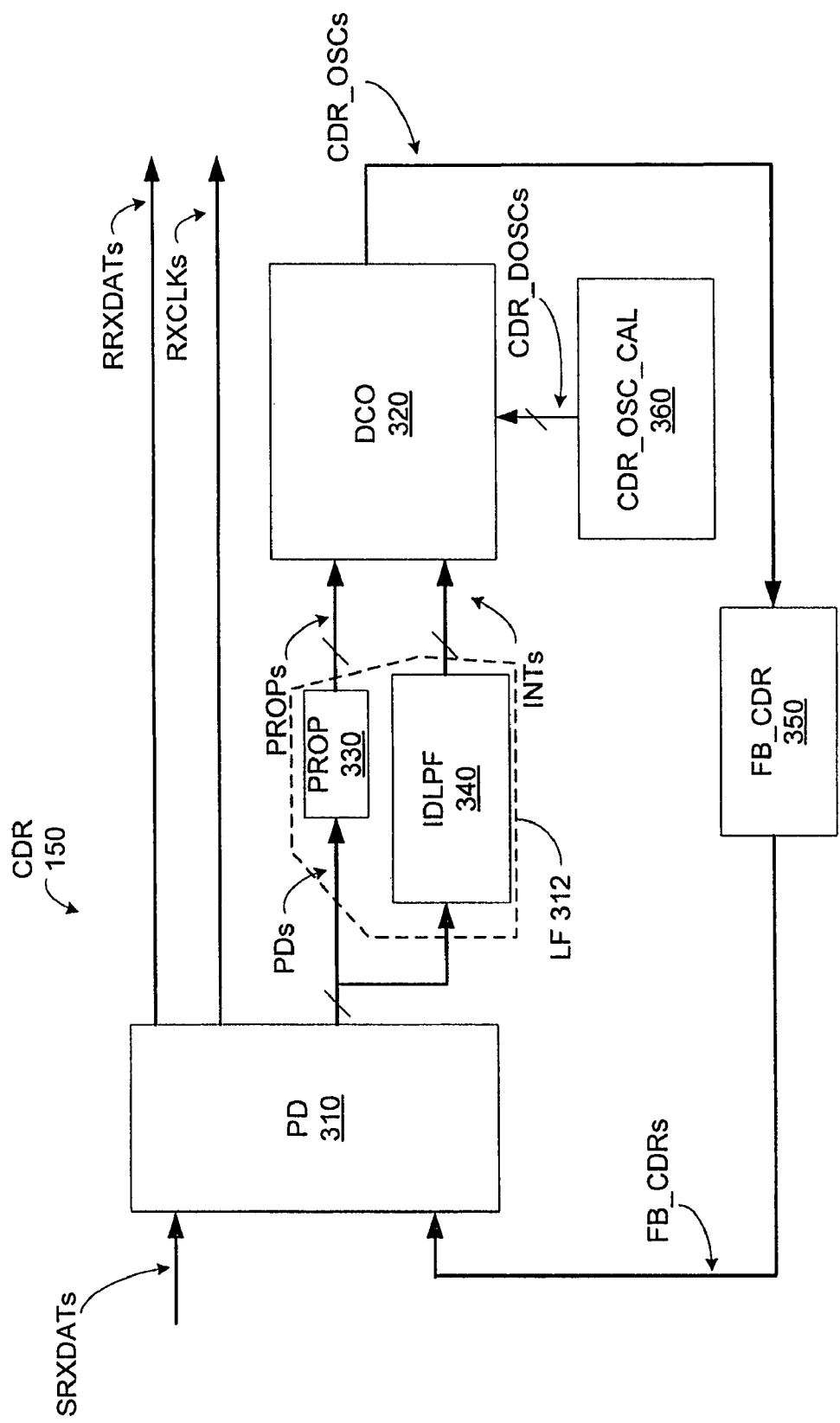
FIG. 3 is a block diagram of a CDR (clock and data recovery) in accordance with an embodiment of the invention.

The concepts described above in respect of FIG. 2 will now be discussed in greater detail as applied to clock and data recovery unit CDR 150 and the clock multiplier unit 110 of FIG. 1. Turning first to clock and data recovery unit CDR 150, FIG. 3 shows a block diagram of clock and data recovery unit CDR 150 in accordance with example embodiments. In the clock and data recovery unit 150, a phase detector block PD 310 receives as inputs the input data SRXDATs and a feedback clock signal FB_CDRs. The transition times of the input data SRXDATs are compared with the clock edges of the feedback clock signal FB_CDRs in the phase detector block PD 310. This comparison results in an error signal PDs at the phase detector PD 310 digital output bus. The error signal PDs is then processed by a dual path digital loop filter 312 that comprises a proportional digital filter PROP 330 and an integral digital filter IDLPF 340. The proportional filter PROP 330 is a low latency path for tuning the digitally controlled oscillator DCO 320, and provides a digital output signal PROPs on a digital bus whose value is proportional to the phase detector 310 output error signal PDs. The digital filter IDLPF 340 provides an integral loop path and generates a digital output signal INTs on a digital bus whose value is proportional to the integral of the error signal PDs over time. The CDR unit 150 includes an oscillator DCO 320 that provides an output clock signal CDR_OSCs to a feedback block FB_CDR 350. In an example embodiment CDR_OSCs could consist of a full-rate clock or a multi-phase clock at a lower rate. In an example embodiment the feedback block FB_CDR 350 is a programmable divider which allows the clock data recover unit CDR 150 to support several different data rates using the same CDR_OSCs frequency. The output clock signal FB_CDRs from the feedback block CDR_FB 350 is provided to the phase detector PD 310. The action of this feedback loop over time is to phase lock the feedback clock signal FB_CDRs to the input data SRXDATs. This allows the data to be recovered. The recovered data RRXDATs and recovered clock signal RXCLKs are outputs of the clock data recovery unit CDR 150.

The clock and data recovery unit CDR 150 also includes a calibration block 360 for providing a calibration signal CDR_DOSCs to the CDR oscillator DCO 320. Some possible embodiments do not include a calibration block 360. In this case the tuning range of the DCO 320 with respect to the tuning signal INTs may need to be increased.

At startup (or periodically) the CDR_OSC_CAL calibration block 360 determines a setting for the digital calibration signal CDR_DOSC which makes the center frequency of CDR oscillator DCO 320 close to the desired frequency of operation. In one embodiment for one mode of operation the calibration process will resume, starting from the result of the previous CDR calibration whenever valid data is not present at SRXDATs. In a second mode of operation the calibration takes place only until valid data is received for the first time at SRXDATs.

The clock data recovery unit 150 loop filter configuration (proportional digital filter PROP 330, integral digital filter IDLPF 340) may in at least some embodiments provide some useful features. First, in some embodiments neither the proportional path (PROP 330) nor the integral path (IDLPF 340) use any large passive components such as capacitors. This makes the loop filter configuration area efficient and allows the system to have a higher stability factor than might otherwise be possible. Second, the separation of the proportional and integral paths allows the latency of each path to be optimized. The proportional path PROP 330 requires low latency in order to minimize the jitter of the recovered clock RXCLKs as well as to maximize the systems tolerance to timing uncertainty of the SRXDATs transitions. The loop filter configuration supports this low latency requirement since generating the PROPs tuning signal requires little or no processing of the error signal PDs. The generation of the integral tuning bus signal INTs may require more processing of the phase detector PD 310 outputs. However, latency in the integral path has far less impact on system performance. This relaxed latency requirement allows the integral loop filter 340 (IDLPF) to be efficiently implemented using a digital filter and even allows the digital filter to be run at a reduced clock speed without sacrificing significant system performance. Additionally since the loop filter and most of the other loop components are digital, the loop and its dynamics are robust with regards to mismatch and component variation. This also can in at least some embodiments reduce the effort required to port the CDR from one semiconductor process to another. The primarily digital nature of the loop also makes it possible to implement a high degree of programmability with regards to the loop dynamics.

Some possible variations on the clock and data recovery shown in FIG. 3 are discussed below.

In some possible embodiments the clock signal CDR_OSCs could be fed back directly to the phase detector PD 310 eliminating the need for a FB_CDR 350 block. Though this may result in the clock and data recovery supporting only a single input data rate, the system would retain at least some of the advantages discussed above.

In some possible embodiments of the clock and data recovery the output error signal PDs can be directly connected to the oscillator DCO 320 instead of PROPs. This can be accomplished in cases where the error signal PDs is suitable to directly drive the proportional tuning input of the oscillator DCO 320. This would allow the clock and data recovery to be implemented without the proportional loop filter PROP 330.

In some possible embodiments the digital signals PROPs and INTs (or PDs and INTS) could be combined into a single digital signal prior to being applied via a bus to a single digital tuning input of DCO 320. Similarly CDR_DOSCs and INTs, CDR_DOSCs and PROPs or all three (CDR_DOSCs, INTs, PROPs) could be combined prior to being applied to the oscillator DCO 320. The process of combining the signals may not significantly impact the clock and data recovery performance. Some possible methods for combining the signals include simple digital addition and concatenation (one signal becomes the most significant bits, the other the least significant bits).

Figure 4:
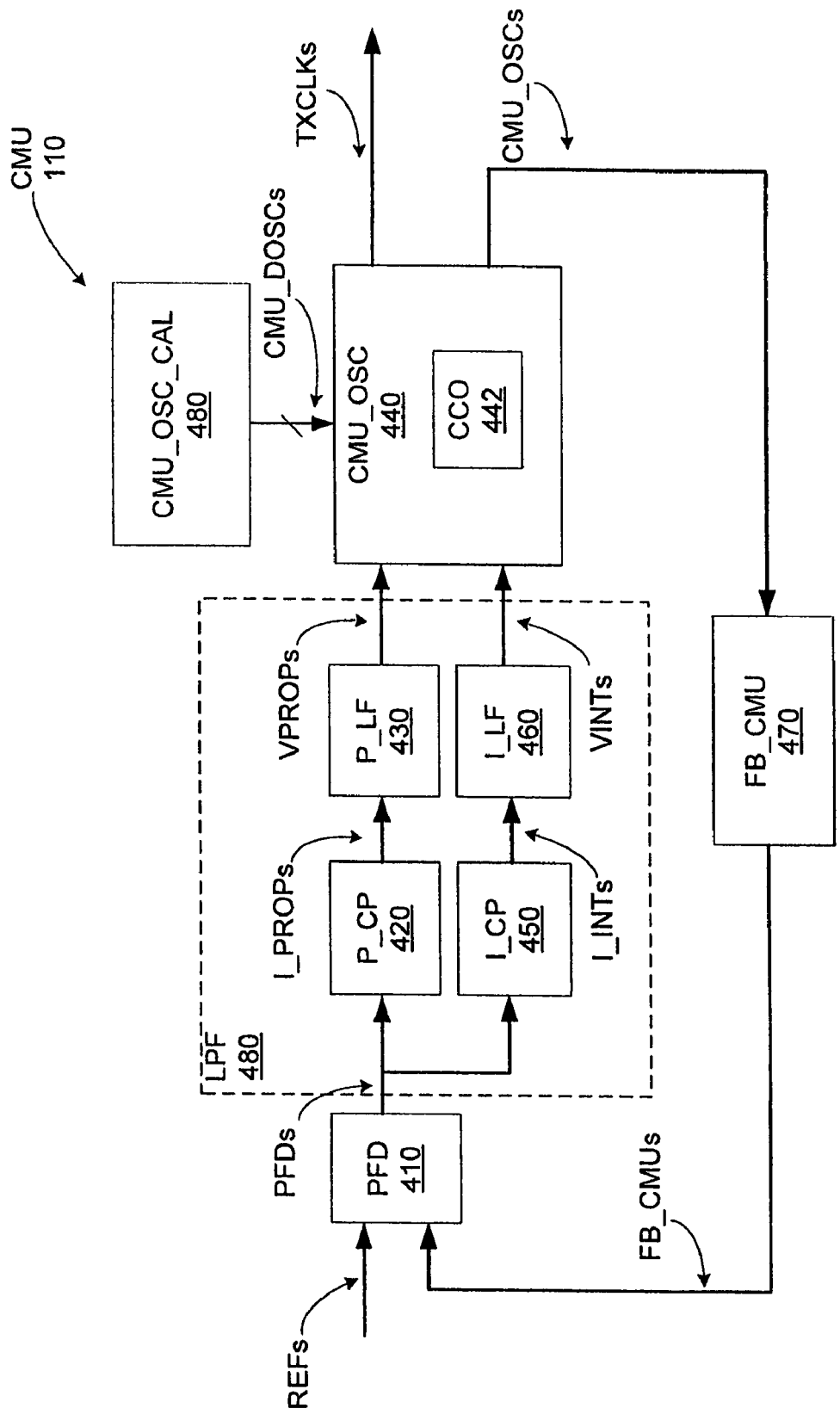
FIG. 4 is a block diagram of a CMU (clock multiplier unit) in accordance with an embodiment of the invention.

Turning now to the clock multiplier unit 110, the concepts described above in respect of FIG. 2 will now be discussed in greater detail as applied to the clock multiplier unit 110. FIG. 4 shows a block diagram of a clock multiplier unit phase lock loop CMU 110 in accordance with an example embodiment. The clock multiplier unit CMU 110 acts to produce output signals CMU_OSCs and TXCLKs whose frequencies are a multiple of the reference clock signal REFs. In example embodiments, the frequency ratio of output signals CMU_OSCs and TXCLKs with regards to reference clock signal REFs can be either integer or non-integer.

The phase and frequency of reference clock signal REFs is compared to that of the feedback clock signal FB_CMUs by a phase frequency detector PFD 410. The resulting error signals PFDs which contain information regarding the phase and frequency error between the reference clock signal REFs and the feedback clock signal FB_CMUs are then further processed by a loop filter LPF 480. The loop filter is divided into proportional and integral paths. In the presently described example embodiment of the invention each path includes a chargepump (proportional charge pump P_CP 420 and integral charge pump I_CP 450, respectively) and a passive filter (proportional loop filter P_LF 430 and integral loop filter I_LF 460, respectively). The proportional path produces a tuning voltage signal VPROPs which is directly proportional to the error signal PFDs and the integral path produces a tuning voltage signal VINTs which is proportional to the integral of the error signal PFDs over time. The signals VPROPs and VINTs are used to tune the frequency of the oscillator CMU_OSC 440. In this embodiment, the differential tuning voltages VPROPs and VINTs are converted to currents within CMU_OSC 440 and then used to tune a current controlled oscillator 442 which forms the core of CMU_OSC 440. Although one particular tuning configuration is shown, it is emphasized that there are many possible approaches to tuning the oscillator 440. The oscillator CMU_OSC 440 output signal CMU_OSCs goes to the feedback block FB_CMU 470. In the illustrated embodiment, feed back block FB_CMU 470 performs an integer or fractional division on the frequency of the oscillator output signal CMU_OSCs to produce a feedback output signal FB_CMUs. The clock multiplier unit CMU 400 includes a calibration unit CMU_OSC_CAL 480. At startup, calibration unit CMU_OSC_CAL 480 determines the value of a calibration signal CMU_DOSCs which places the frequency of oscillator CMU_OSC 440 close to the desired frequency of operation.

The loop filter configuration shown in FIG. 4 may in at least some embodiments provide some useful features. For example, it is possible to scale down the current in integral chargepump I_CP 450 with respect to the current in proportional chargepump P_CP 420, thereby allowing the proportional path to have a relatively large current and therefore lower impedance in its passive filter components. This can help reduce noise in the signal VPROPs and allow for improved jitter performance in some applications. Scaling of the integral path current allows the loop to be sufficiently well damped while having passive components in the filter I_LF 460 which do not consume significant area. Similarly the current scaling between the proportional and integral chargepumps may allow the system to have a significantly lower loop bandwidth than would otherwise be possible given a fixed area. Another possible advantage is that during the lock condition the signals VPROPs and I_PROPs are near their neutral value, which can reduce the impact of several second order chargepump effects (such as non-linearity) which become more pronounced as the signals VPROPs and I_PROPs move away from their neutral values.

Some possible variations on the clock multiplier unit illustrated in FIG. 4 are discussed below.

Some possible embodiments of the clock multiplier unit do not include the calibration unit CMU_OSC_CAL 480. Though the tuning range of the oscillator CMU_OSC 440 may need to be increased with respect the tuning input VINTs, the system may retain at least some of the advantages discussed above.

Some possible embodiments of the clock multiplier unit generate a single or multi-phase clock signal TXCLKs. Additionally the clock signal TXCLKs may have a full rate, half rate or lower frequency. Since clock signal TXCLKs is an output signal, such embodiments may retain at least some of the advantages described above.

Some possible embodiments of the clock multiplier unit may use the same clock signal for both TXCLKs and CMU_OSCs. Since it is possible that the output clock signal TXCLKs also be used as the output clock signal CMU_OSCs such an embodiment may retain least some of the advantages described above.

Figure 5:
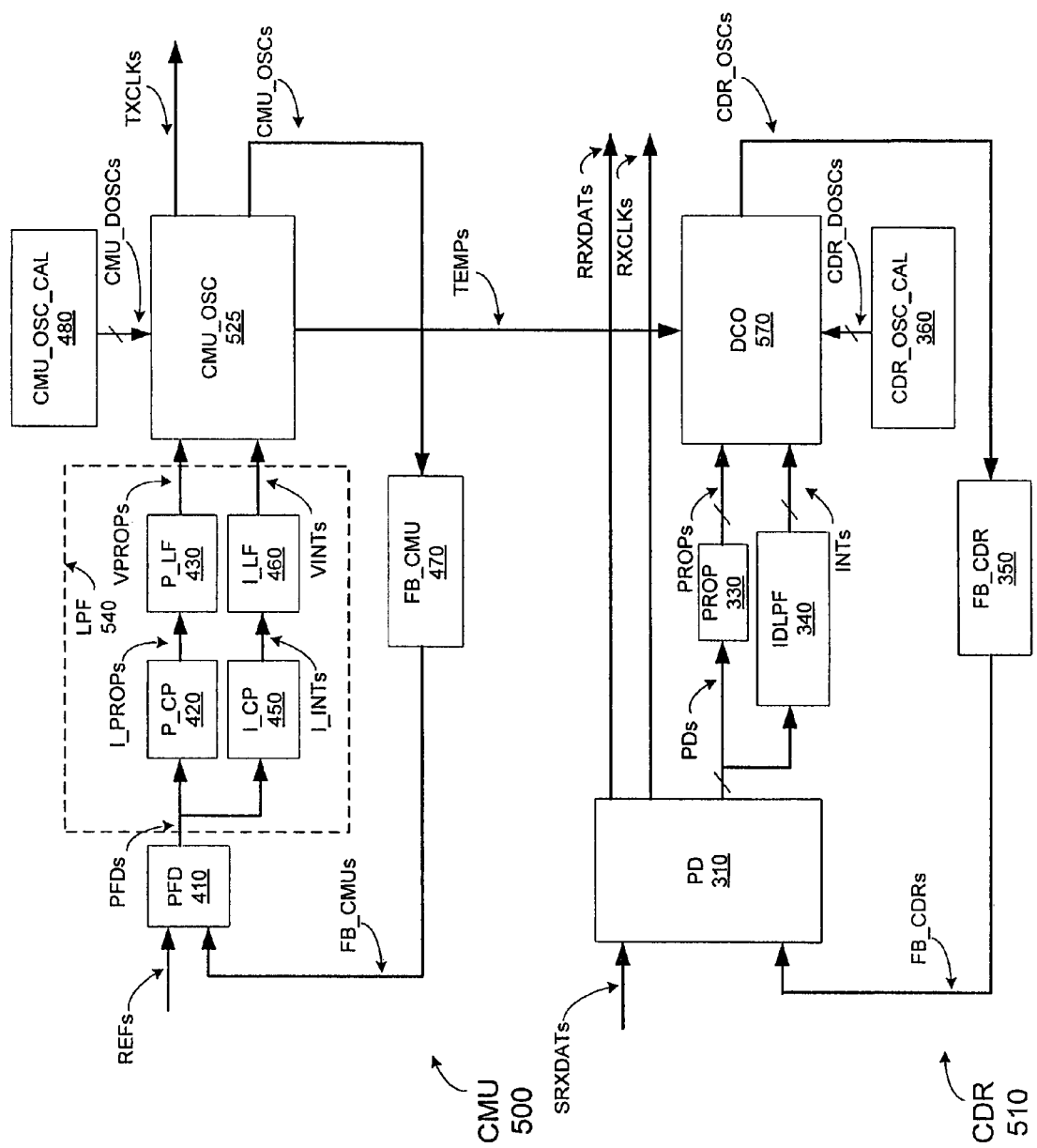
FIG. 5 is a block diagram illustrating the compensation of the CDR oscillator's center frequency via a compensation signal generated by the CMU in accordance with an embodiment of the invention.

FIG. 5 illustrates a further embodiment of the invention. The circuit of FIG. 5 includes a SERDES clock data recovery unit CDR 510 that is similar to clock data recovery unit CDR 150 described above except for differences that will be apparent from the figures and the following description. The circuit of FIG. 5 also includes a SERDES clock multiplier unit CMU 500 that is similar to clock multiplier unit CMU 110 described above except for differences that will be apparent from the figures and the following description. The clock data recovery unit CDR 510 and the clock multiplier unit CMU 500 can be used in a SERDES such as shown in FIG. 1. In the embodiment of FIG. 5, the clock multiplier unit 500 oscillator CMU_OSC 525 and the clock data recovery unit 510 oscillator DCO 570 have oscillator cores that are topologically identical. In one example embodiment, the core of the oscillator DCO 570 in clock data recover unit CDR 510 is a half size replica of the core of the oscillator CMU_OSC 525 in clock multiplier unit CMU 500. This similarity between the two cores insures that their tuning curves are nearly identical across supply voltage temperature and process. It should be emphasized that this relationship could be retained for various scaling factors between the two oscillator cores as well as for moderate topological differences between the two oscillators.

Another feature of the embodiment illustrated by FIG. 5 is the compensation signal TEMPs, which is provided by the clock multiplier unit oscillator CMU_OSC 525 to the clock data recovery unit oscillator DCO 570. In the illustrated embodiment, the compensation signal TEMPs is a current proportional to the clock multiplier unit CMU 500 integral tuning signal VINTs. However any signal proportional to the integral of the phase frequency detector PFD 410 output error signal PFDs would be a suitable substitute.

In an example embodiment, the CMU 500 oscillator CMU_OSC 525 has a larger integral tuning range than the CDR oscillator DCO 570. This difference in tuning ranges is not fundamental to the respective oscillator architectures, but is a result of practical concerns. Having a large integral tuning range on DCO 570 is expensive (in terms of area and power) due to the size and resolution of the required digital to analog converters. In contrast a reasonable integral tuning range is easily implemented for CMU_OSC 525. Since the two oscillator cores are very similar, it is possible to leverage the larger integral tuning range of the CMU oscillator CMU_OSC 525 to produce a compensation signal TEMPs which can be used to greatly reduce the variation of the CDR oscillator DCO 570 center frequency and thus the requirement for CDR oscillator DCO 570 integral tuning range. In the example embodiment of FIG. 5, this assists the clock data recovery unit CDR 510 to function correctly across its temperature and voltage range despite the fact that without the compensation signal (TEMPs) the variation in DCO 570 center frequency may exceed the available tracking range.

In some configurations, in order to take full advantage of this compensation scheme, the embodiment of FIG. 5 utilizes the following method for the calibration of the two loops.

First, both loops are held in their disabled (reset) state.

Second, CMU oscillator CMU_OSC 525 and CMU calibration block CMU_OSC_CAL 480 are activated with the CMU feedback loop disabled. A value for the calibration signal CMU_DOSCs is chosen such that the center frequency of CMU oscillator CMU_OSC 525 is close to the desired frequency of operation.

Third, the feedback loop for clock multiplier unit CMU 500 is activated causing the loop to phase lock and the residual phase/frequency error to be eliminated. The locking process causes a small correction signal to be applied to compensation signal TEMPs. This correction is proportional to the residual frequency error.

Fourth, the CDR oscillator DCO 570 and the CDR calibration block CDR_OSC_CAL 360 are activated with the CDR feedback loop disabled. A value for the calibration signal CDR_DOSCs is chosen such that the CDR oscillator DCO 570 center frequency is close to the desired frequency of operation.

Fifth, in a primary mode of operation, the calibration routine will continue to update the value of the calibration signal CDR_DOSCs until valid data is present at the SRXDATs input to phase detector 310. If the data at the SRXDATs input is no longer available, the calibration routine resumes, starting at the calibration signal CDR_DOSCs value where it left off. When valid data is present at the SRXDATs input the CDR 510 feedback loop is enabled and the CDR loop phase locks, eliminating any residual phase/frequency error.

This method allows the two loops to be calibrated without problematic interactions despite the presence of the compensation signal TEMPs. Additionally, this sequencing prevents the residual error in the calibrations from accumulating at the clock data recovery unit CDR 510.

Figure 6:
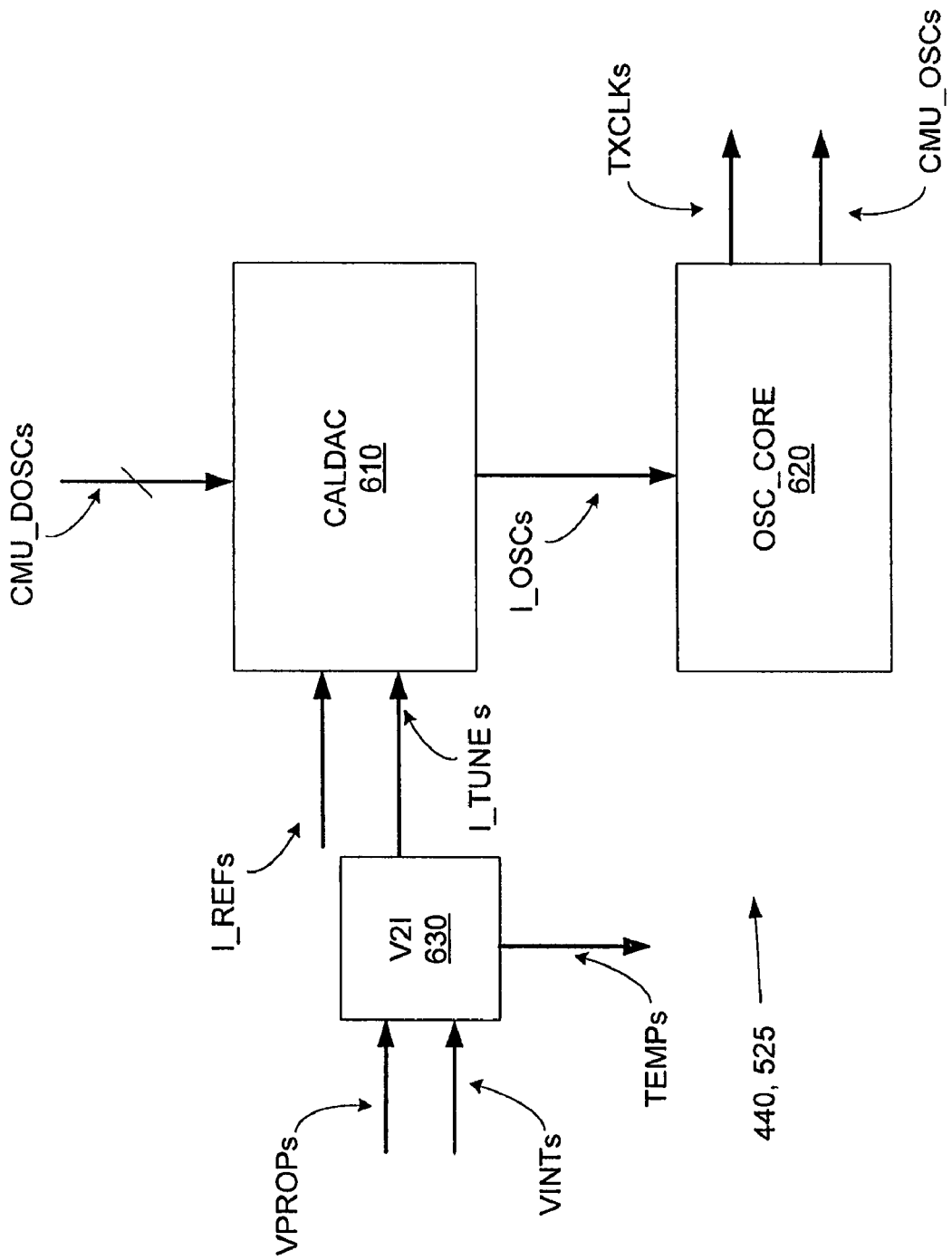
FIG. 6 is a block diagram of an oscillator for the CMU in accordance with an embodiment of the invention.

FIG. 6 shows a block diagram of an internal structure of the CMU oscillator 440, 525 according to example embodiments of the invention. The CMU oscillator 440, 525 includes a calibration digital to analog converter CALDAC 610, a voltage to current converter V2I 630, and an oscillator core 620. The calibration digital to analog converter CALDAC 610 has three inputs: reference current I_REFs, a tuning current I_TUNEs and calibration signal CMU_DOSCs, and outputs an output current I_OSCs for controlling the oscillator core OSC_CORE 620. I_REFs is a reference current which remains fixed during normal operation. In example embodiments, the current I_REF is heavily filtered in order to reduce its contribution to the noise of I_OSCs. I_TUNE is a tuning current proportional to the sum of the loop filter signals VPROPs and VINTs. In the currently described embodiment the current I_TUNE is generated by the voltage to current converter V2I 630. Voltage to current converter V2I 630 also generates the compensation signal TEMPs for use in the compensating the center frequency of the CDR oscillator. The calibration signal CMU_DOSCs is applied through a digital bus to control the output current I_OSCs of calibration digital to analog converter CALDAC 610. In the presently described example embodiment the calibration digital to analog converter CALDAC 610 output current (I_OSCs) is composed of two components; the first is proportional to a weighted sum of the two input currents I_REFs and I_TUNEs but is independent of the value of calibration signal CMU_DOSCs. The second is proportional to both a weighted sum of the input currents I_REFs and I_TUNEs and the value of calibration signal CMU_DOSCs. In one example embodiment, during the calibration process the value of the digital signal CMU_DOSCs is chosen such that for the neutral value of the tuning current I_TUNEs the frequency of the oscillator core OSC_CORE 620 is close to the desired operating frequency. This calibration allows the range of the variable tuning current I_TUNEs to be greatly reduced since the loop needs only track variations that occur after the calibration process is complete (such as changes in temperature). This allows the majority of control current I_OSCs to be derived from the highly filtered reference current I_REFs which can improve the jitter performance of the oscillator.

Figure 7:
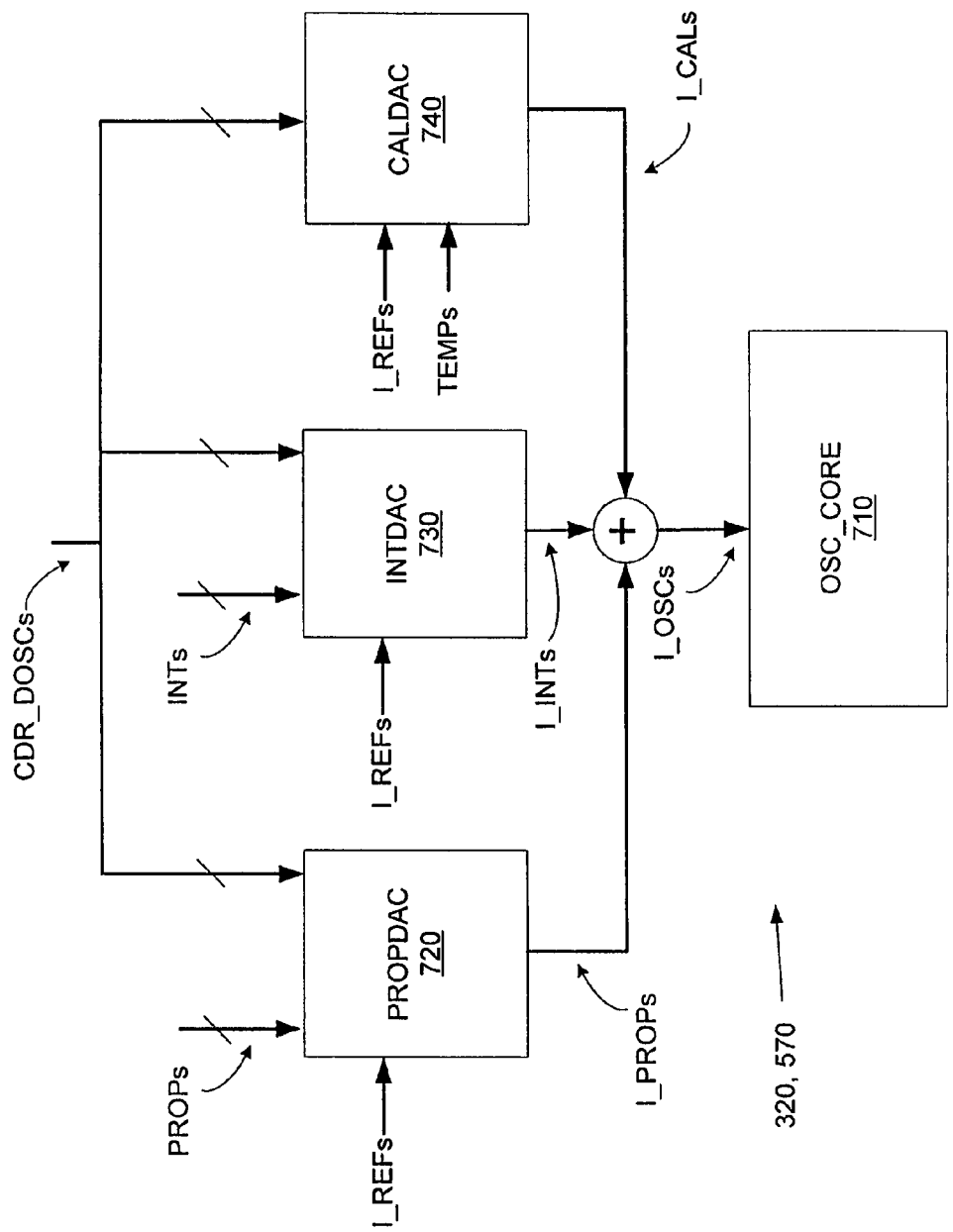
FIG. 7 is a block diagram of an oscillator for the CDR in accordance with an embodiment of the invention.

FIG. 7 shows a block diagram of the internal structure of the CDR oscillator 320, 570 in accordance with example embodiments. The CDR oscillator 320 includes a oscillator core 710, a calibration digital to analog converter CALDAC 740, an integral digital to analog converter INTDAC 730, and a proportional digital to analog converter PROPDAC 720. The tuning current I_OSCs for the oscillator core OSC_CORE 710 is generated by the summed output of the three digital to analog converters 720, 730 and 740. The calibration digital to analog converter CALDAC 740 has three inputs, including a reference current I_REFs, compensation current TEMPs, and calibration signal CDR_DOSCs. I_REFs is a reference current which remains fixed during normal operation, and in at least some embodiments this current is heavily filtered in order to reduce its contribution to the noise of tuning current I_OSCs. The compensation signal TEMPs is a current generated by the CMU 500 in order to compensate the frequency variation of the oscillator core OSC_CORE 710. The calibration signal CDR_DOSCs is received over a digital bus containing the value resulting from the CDR calibration process. In example embodiments the calibration digital to analog converter CALDAC 740 output current I_CALs is composed of two components; the first component is proportional to a weighted sum of the two input currents I_REFs and TEMPs but is independent of the value of the calibration signal CDR_DOSCs. The second component is proportional to both a weighted sum of the input currents I_REFs and TEMPs and the value of the calibration signal CDR_DOSCs.

The integral digital to analog converter INTDAC 730 has three inputs: the reference current I_REFs, the calibration signal CDR_DOSCs and the integral path output signal INTs received via a digital bus from the from the integral loop filter IDLPF 340. In an example embodiment the signal INTs digital loop filter IDLPF 340 is proportional to the integral of the CDR phase detector's PD 310 output over time. The use of the calibration signal CDR_DOSCs control bits in this block serves to keep the ratio between the integral digital to analog converter INTDAC 730 output current I_INTs and I_CALs relatively constant with respect to changes in the value of the calibration signal CDR_DOSCs. The proportional current digital to analog converter PROPDAC 720 has three inputs; the reference current I_REFs, the calibration signal CDR_DOSCs and the PROPs signal that is output by proportional loop filter 330 onto a digital bus whose value in proportional to the output of the CDR phase detector PD 310. As in the case of integral digital to analog converter INTDAC 730, the proportional current digital to analog converter PROPDAC 720 employs the CDR_DOSCs bits to insure that the ratio between I_PROPs, I_INTs and I_CALs remains relatively constant for different values of CDR_DOSCs. I_PROPs, I_INTs and I_CALs are all summed together to produce I_OSCs which is the tuning current for the oscillator core OSC_CORE 710.

In some configurations, the architecture of FIG. 7 may provide useful benefits such as: By insuring that the ratio of the various tuning currents remains relatively fixed with respect to the CDR_DOSCs bits the variability of the CDR loop dynamics is greatly reduced. Additionally, all of the tuning inputs related to loop dynamics (IDLPFs, PROPs) are digital which also minimizes variability and makes this architecture very robust when ported between semiconductor processes. Finally the use of the compensation signal I_TEMPs to compensate variation in the OSC_CORE 710 center frequency allows INTDAC 730 to be significantly physically smaller than might otherwise be possible.

In a possible alternate embodiment of the oscillator shown in FIG. 7 the integral digital to analog converter INTDAC 730 and/or the proportional digital to analog converter PROPDAC 720 would not make use of the CDR_DOSCs signal. Though this may increase the variability of CDR loop dynamics, at least one of the advantages discussed above may be retained.

Figure 8:
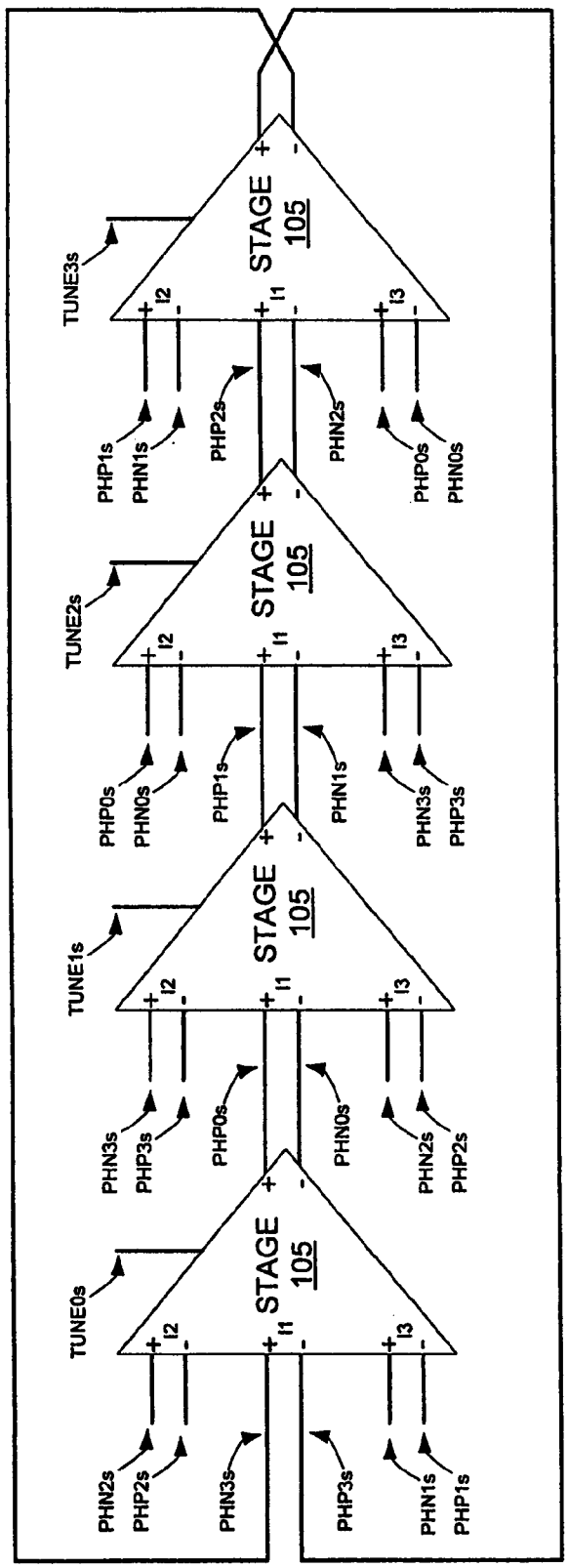
FIG. 8 is a block diagram showing the oscillator core topology used in both the CDR and the CMU in accordance with the embodiment of the invention.

FIG. 8 shows a ring oscillator topology which in example embodiments may be used for the cores 620, 710 of both the CMU and CDR oscillators. In the embodiment of FIG. 8, the core includes 4 identical differential delay stages STAGE 105 each with 7 inputs. TUNE0s, TUNE1s, TUNE2s and TUNE3s are tuning input signals to each the four stages. They tune the delay of each STAGE 105. In the present embodiment all of the tuning inputs are connected to a single tuning current. It should be emphasized that there are several different options with regards to tuning, including tuning the stages independently via multiple tuning currents and tuning each STAGE 105 with a single or multiple tuning voltages. The other six inputs to each stage 105 include differential signals fed back from the outputs of the three other stages 105. Since there are four stages and due to symmetry the phases of the eight output signals will be equally spaced. PHP0s, PHP1s, PHP2s, PHP3s, PHN0s, PHN1s, PHN2s, PHN3s are at 0, 45, 90, 135, 180, 225, 270, 315 degrees respectively. It should also be noted that each pair such as PHP0s, PHN0s form a differential pair of signals. The phase of the output signal for each stage (ex. PHP0s, PHN0s) is the result of a weighted sum of the input phases plus the delay of the stage itself.

In some configurations, this arrangement can be beneficial in that by feeding signals forward and effectively bypassing stages it is possible to cause the ring as a whole to oscillate at a significantly higher frequency than would be possible in a simple ring topology using the same delay stages. Feeding signals forward bypassing a single stage produces some improvement in oscillation frequency. Feeding signals forward bypassing both a single and two stages produces further improvement in oscillation frequency. This is achieved while still maintaining the desired equal spacing of the phases present in the oscillator. This topology can be useful in systems such a the SERDES that require the generation of multiple clock phases at high frequency.

Variations and modifications to the above-described embodiments are possible.

The invention claimed is:

1. A clock and data recovery circuit, comprising:
a phase detector for comparing an incoming serial data signal with a feedback clock signal and generating a digital phase detector output signal representing a phase difference between the incoming data signal and the feedback clock signal;
a dual path filter for receiving the phase detector output signal, the dual path filter including a first path for generating a digital proportional output signal that is proportional to the phase detector output signal and a second path having an integral digital filter for generating a digital integral output signal that is proportional to an integral of the phase detector output signal;
a digitally controlled oscillator for receiving the proportional output signal and the integral output signal as tuning inputs and generating in dependence thereon an output clock signal from which the feedback clock signal is obtained; and
a clock multiplier unit (CMU) for providing a temperature compensation signal to the digitally controlled oscillator, comprising:
a phase frequency detector for comparing a reference clock signal with a CMU feedback clock signal and generating a CMU error signal representing a phase difference and a frequency difference between the reference clock signal and the CMU feedback clock signal;
a loop filter for receiving the CMU error signal and producing tuning signals that are representative of the CMU error signal; and
an oscillator for receiving the tuning signals and generating in dependence thereon a CMU output clock signal from which the CMU feedback clock signal is obtained,
the temperature compensation signal being derived from the CMU error signal.

2. The clock and data recovery circuit of claim 1 comprising a feedback block having a divider for dividing the output clock signal from the digitally controlled oscillator to provide the feedback clock signal for the phase detector.

3. The clock and data recovery circuit of claim 1 comprising a calibration block for providing a calibration signal to the digitally controlled oscillator, the calibration signal being selected to cause the digitally controlled oscillator to generate the output clock signal substantially at a desired frequency of operation.

4. The clock and data recovery circuit of claim 1 wherein the first path of the dual path filter includes a proportional filter for generating the proportional output signal.

5. The clock and data recovery circuit of claim 1 wherein the phase detector outputs a recovered serial data signal and a recovered clock signal in dependence on the incoming serial data signal and the feedback clock signal.

6. The clock and data recovery circuit of claim 1 wherein the first path of the dual path filter includes a proportional filter for generating the proportional output signal, and the clock and data recovery circuit comprises a calibration block for providing a calibration signal to the digitally controlled oscillator, the calibration signal being selected to cause the digitally controlled oscillator to generate the output clock signal substantially at a desired frequency of operation.

7. The clock and data recovery circuit of claim 6 wherein the phase detector outputs a recovered serial data signal and a recovered clock signal in dependence on the incoming serial data signal and the feedback clock signal, and the clock and data recovery circuit comprises a feedback block having a divider for dividing the output clock signal from the digitally controlled oscillator to provide the feedback clock signal for the phase detector.

8. The clock and data recovery circuit of claim 1 wherein the clock multiplier unit oscillator and the digitally controlled oscillator each have oscillator cores that are substantially topographically identical.

9. The clock and data recovery circuit of claim 8 wherein the digitally controlled oscillator core is a smaller scale version of the clock multiplier unit oscillator core.

10. A clock and data recovery circuit, comprising:
a phase detector for comparing an incoming serial data signal with a feedback clock signal and generating a digital phase detector output signal representing a phase difference between the incoming data signal and the feedback clock signal;
a dual path filter for receiving the phase detector output signal, the dual path filter including a first path for generating a digital proportional output signal that is proportional to the phase detector output signal and a second path having an integral digital filter for generating a digital integral output signal that is proportional to an integral of the phase detector output signal; and
a digitally controlled oscillator for receiving the proportional output signal and the integral output signal as tuning inputs and generating in dependence thereon an output clock signal from which the feedback clock signal is obtained, comprising:
a calibration digital to analog converter for receiving a reference current signal and a calibration signal and outputting in dependence thereon a calibration current;
an integral digital to analog converter for receiving the reference current, the calibration signal and the integral output signal and outputting an integral current in dependence thereon that is proportional to the integral output signal;
a proportional digital to analog converter for receiving the reference current, the calibration signal and the proportional output signal and outputting a proportional current in dependence thereon that is proportional to the proportional output signal; and
an oscillator core for receiving a sum of the signals output from the calibration digital to analog converter, the integral digital to analog converter, and the proportional digital to analog converter and outputting the output clock signal in dependence thereon.

11. The clock and data recovery circuit of claim 10 wherein the calibration-current includes a first component that represents the reference current signal and a second component that is proportional to a weighted sum of the reference current signal and the calibration signal.

12. The clock and data recovery circuit of claim 1 wherein the oscillator includes a multi-stage ring oscillator circuit for generating the output clock signal, the multi-stage ring oscillator circuit comprising a ring of at least four identical differential delay stages, wherein each delay stage has three pairs of differential inputs and one pair of differential outputs, and each delay stage receives as differential inputs the differential outputs of three preceding delay stages.

13. The clock and data recovery circuit of claim 1 wherein the circuit is implemented in a serial data receive path in a serializer/deserializer circuit.

14. The clock and data recovery circuit of claim 1 wherein the output clock signal is a full-rate clock or a multi-phase clock at a lower rate than a full-rate clock.

15. A clock multiplier phase locking circuit for producing an output signal that is a multiple of a reference clock signal, comprising:
- a phase frequency detector for comparing a reference clock signal with a feedback clock signal and generating an error signal representing a phase difference and a frequency difference between the reference clock signal and the feedback clock signal;
- a loop filter for receiving the error signal, the loop filter comprising a proportional path and an integral path, the proportional path including a proportional chargepump and a first passive filter for producing a proportional tuning voltage signal that is proportional to the error signal, the integral path including an integral chargepump and a second passive filter for producing an integral tuning voltage signal that is proportional to an integral of the error signal;
- an oscillator for receiving the proportional tuning signal and the integral tuning signal as tuning inputs and generating in dependence thereon an output clock signal from which the feedback clock signal is obtained, comprising:
  - a voltage to current converter for receiving the proportional tuning signal and the integral tuning signal as voltage signals from the loop filter and outputting a tuning current proportional to a sum of the proportional tuning signal and the integral tuning signal;
  - a calibration digital to analog converter for receiving as converter inputs a reference current, the tuning current, and a calibration signal and producing in dependence on the converter inputs a control current, the control current including a first component proportional to a weighted sum of the reference current and the tuning current and a second component proportional to a weighted sum of the reference current, the tuning current and the calibration signal; and
  - an oscillator core for receiving the control current and outputting the output clock signal in dependence thereon; and
- a feedback block having a divider for dividing the output clock signal from the oscillator to provide the feedback clock signal for the phase frequency detector.

16. The clock multiplier phase locking circuit of claim 15 wherein the oscillator core includes a multi-stage ring oscillator circuit comprising a ring of at least four identical differential delay stages, wherein each delay stage has three pairs of differential inputs and one pair of differential outputs, and each delay stage receives as differential inputs the differential outputs of three preceding delay stages.

17. The clock multiplier phase locking circuit of claim 15 wherein the circuit is implemented in a serial/deserializer circuit.

18. The clock and data recovery circuit of claim 10 comprising a feedback block having a divider for dividing the output clock signal from the digitally controlled oscillator to provide the feedback clock signal for the phase detector.

19. The clock and data recovery circuit of claim 10 comprising a calibration block for providing a calibration signal to the digitally controlled oscillator, the calibration signal being selected to cause the digitally controlled oscillator to generate the output clock signal substantially at a desired frequency of operation.

20. The clock and data recovery circuit of claim 10 wherein the first path of the dual path filter includes a proportional filter for generating the proportional output signal.

21. The clock and data recovery circuit of claim 10 wherein the phase detector outputs a recovered serial data signal and a recovered clock signal in dependence on the incoming serial data signal and the feedback clock signal.

22. The clock and data recovery circuit of claim 10 wherein the first path of the dual path filter includes a proportional filter for generating the proportional output signal, and the clock and data recovery circuit comprises a calibration block for providing a calibration signal to the digitally controlled oscillator, the calibration signal being selected to cause the digitally controlled oscillator to generate the output clock signal substantially at a desired frequency of operation.

23. The clock and data recovery circuit of claim 22 wherein the phase detector outputs a recovered serial data signal and a recovered clock signal in dependence on the incoming serial data signal and the feedback clock signal, and the clock and data recovery circuit comprises a feedback block having a divider for dividing the output clock signal from the digitally controlled oscillator to provide the feedback clock signal for the phase detector.

24. The clock and data recovery circuit of claim 10 wherein the oscillator includes a multi-stage ring oscillator circuit for generating the output clock signal, the multi-stage ring oscillator circuit comprising a ring of at least four identical differential delay stages, wherein each delay stage has three pairs of differential inputs and one pair of differential outputs, and each delay stage receives as differential inputs the differential outputs of three preceding delay stages.

25. The clock and data recovery circuit of claim 10 wherein the circuit is implemented in a serial data receive path in a serializer/deserializer circuit.

26. The clock and data recovery circuit of claim 10 wherein the output clock signal is a full-rate clock or a multi-phase clock at a lower rate than a full-rate clock.

* * * * *